US009029269B2

(12) United States Patent
Bourbina et al.

(10) Patent No.: US 9,029,269 B2
(45) Date of Patent: May 12, 2015

(54) WAFER BONDING SYSTEM AND METHOD FOR BONDING AND DEBONDING THEREOF

(75) Inventors: Michael Bourbina, Midland, MI (US); Jeffrey N. Bremmer, Midland, MI (US); Eric S. Moyer, Midland, MI (US); Sheng Wang, Midland, MI (US); Craig R. Yeakle, Midland, MI (US)

(73) Assignee: Dow Corning Corporation, Midland, MI (US)

( * ) Notice: Subject to any disclaimer, the term of this patent is extended or adjusted under 35 U.S.C. 154(b) by 0 days.

(21) Appl. No.: 14/001,298

(22) PCT Filed: Feb. 24, 2012

(86) PCT No.: PCT/US2012/026448
§ 371 (c)(1),
(2), (4) Date: Oct. 29, 2013

(87) PCT Pub. No.: WO2012/118700
PCT Pub. Date: Sep. 7, 2012

(65) Prior Publication Data
US 2014/0057450 A1 Feb. 27, 2014

Related U.S. Application Data

(60) Provisional application No. 61/447,270, filed on Feb. 28, 2011.

(51) Int. Cl.
*H01L 21/683* (2006.01)
*B32B 7/12* (2006.01)
*B32B 33/00* (2006.01)
*H01L 21/304* (2006.01)

(52) U.S. Cl.
CPC .............. *B32B 7/12* (2013.01); *H01L 21/6835* (2013.01); *H01L 21/6836* (2013.01); *H01L 2221/68318* (2013.01); *H01L 2221/68327* (2013.01); *H01L 2221/68381* (2013.01); *B32B 33/00* (2013.01); *H01L 21/304* (2013.01)

(58) Field of Classification Search
CPC ................................ H01L 21/30; H01L 21/46
USPC ............ 438/459, 759; 257/E21.122, E21.211
See application file for complete search history.

(56) References Cited

U.S. PATENT DOCUMENTS

| | | | | |
|---|---|---|---|---|
| 7,883,991 B1 * | 2/2011 | Wu et al. | ......................... | 438/459 |
| 2005/0000636 A1 * | 1/2005 | Geiger et al. | .................. | 156/247 |
| 2007/0275255 A1 * | 11/2007 | Ooms et al. | .................... | 428/447 |
| 2008/0090380 A1 * | 4/2008 | Gardner et al. | ................ | 438/455 |

* cited by examiner

*Primary Examiner* — Kimberly Rizkallah
*Assistant Examiner* — Brian Turner
(74) *Attorney, Agent, or Firm* — Dow Corning Corporation

(57) ABSTRACT

A method of treating the surface of a semiconductor wafer through the formation of a bonding system is provided in order to enhance the handling of the wafer during subsequent processing operations. The method generally comprises the steps of applying a release layer and an adhesive to different wafers; bonding the wafers together to form a bonded wafer system; performing at least one wafer processing operation (e.g., wafer grinding, etc.) to form a thin processed wafer; debonding the wafers; and then cleaning the surface of the processed wafer with an organic solvent that is capable of dissolving the release layer or any residue thereof. The adhesive includes a vinyl-functionalized polysiloxane oligomeric resin, a Si—H functional polysiloxane oligomeric resin, a catalyst, and optionally an inhibitor, while the release layer is comprised of either a silsesquioxane-based resin or a thermoplastic resin.

20 Claims, 3 Drawing Sheets

WAFER BONDING SYSTEM AND METHOD FOR BONDING AND DEBONDING THEREOF

CROSS REFERENCE TO RELATED APPLICATIONS

This application is a continuation of PCT Application Serial No. PCT/US2012/026448 filed Feb. 24, 2012, designating the United States and published in English, which claims the benefit of the filing date under 35 U.S.C. 119(e) of U.S. Provisional Application No. 61/447,270 filed Feb. 28, 2011, the entire contents of each of which are hereby incorporated herein by reference.

FIELD

This disclosure relates generally to materials and processes for the treatment of wafers used in the production of semiconductor products. More specifically, this disclosure relates to the preparation of adhesive and release layer compositions and their use as temporary wafer bonding materials.

BACKGROUND

The microelectronic industry uses very thin, patterned wafers (e.g., <50 micrometers) in the fabrication of semiconductor devices that require a high level of data processing speed, thereby, leading to the requirement of having a high level of wafer packing, and the ability to perform through-silicon via (TSV) processing and/or withstand wafer grinding. These semiconductor devices are used in many different applications, such as in 3-D packaging and in light emitting diodes (LED). However, since the patterned wafer is very thin, it also tends to be very fragile. Thus the handling of these wafers during the production of a semiconductor device requires processes and materials that are specifically designed to keep the wafer from being damaged. In this respect, temporary wafer bonding and debonding methods have emerged to become a key step in the manufacturing process.

The microelectronic industry currently uses both a one-layer and two-layer approach to accomplish temporary wafer bonding and debonding during the production of semiconductor devices. The basic requirements for temporary wafer bonding include: (i) ability to withstand exposure to at least 180° C.; (ii) ability to survive grinding; (iii) easy to be debonded and cleaned; (iv) high throughput (20-30 wafers/hour); and (v) resistance to many typical chemicals (solvents, acids, bases, etc.) used in semiconductor industry. Spin coating is expected to be used for coating the materials onto the wafers due to the thickness control, simplicity and fast processing that is achievable. A film thickness up to 100 microns with less than 1% thickness variation is required.

The one-layer approach uses a thermal sliding mechanism as described in U.S. Patent Publication No. 2008/0173970. More specifically, a crosslinked oxazoline is used to bond a patterned wafer to a support wafer. After wafer grinding and TSV processing is performed, the wafers are separated by exposing the wafers to a high temperature (285° C.), followed by mechanically sliding the wafers apart. Since the bonding and debonding need to be done at high temperature and harsh solvent cleaning is required to remove any residue, this approach can lead to both low yield and low productivity.

The two-layer approach uses an additional layer to help debond the support wafer from the thin patterned wafer first as described in U.S. Patent Publication No. 2009/0115075. In this approach, a glass support wafer is coated with a thin layer of a thermal sensitive material, e.g., a Light to Heating Conversion (LTHC) material. An adhesive is sandwiched between the LTHC coated glass wafer and a patterned wafer and cured via UV light irradiated through the glass wafer. After wafer thinning and TSV processing is performed, a laser irradiates the stack through the glass wafer to assist in debonding the glass wafer. The adhesive is then peeled off from the patterned wafer. Several disadvantages associated with this approach include the use of both UV and laser sources, the limited lifetime and thermal issues associated with glass support wafers, and the difficulty associated with removing the adhesive from the patterned wafer.

U.S. Patent Publication No. 2010/0330788 describes a thin wafer handling structure that includes a semiconductor wafer, a release layer, an adhesive layer, and a carrier wafer. The structure is bonded together and post bonding processes are performed. The carrier wafer and semiconductor wafer are then separated by applying energy in the form of ultraviolet light or a laser to the release layer. The adhesive on the semiconductor wafer is finally removed by a chemical soaking operation. One disadvantage associated with this approach is related to the cost and difficulty associated with using a UV or laser source to debond the wafers after post-bonding processes are performed.

U.S. Pat. No. 7,482,249 describes the application of a thin layer of a silicon-based material (about 1000 Angstroms) onto a patterned wafer and a solvent-free silicone material (approximately 100 microns) onto a support wafer. The coated patterned wafer is treated with plasma to modify the surface property to improve the compatibility of the release layer material with the silicone adhesive material prior to a bonding step. The bonded wafers are heated to high temperature in order to cure the adhesive. After wafer processing, the thin patterned wafer is attached to a dicing type and removed from the adhesive by taking the advantage of the anisotropic adhesion property of the release layer. In this approach, the coated materials remain to be liquid after being applied to the wafers, making it difficult to manipulate or handle during subsequent processing. In addition, the materials need to be plasma treated, making the process complicated and cost ineffective.

SUMMARY

In overcoming the enumerated drawbacks and other limitations of the related art, the present disclosure generally provides a method for treating the surface of a semiconductor wafer to enhance handling of the wafer during subsequent processing operations. According to one aspect of the present disclosure, the method comprises the steps of applying a release layer to a surface of a first wafer to form a release layer coated wafer; applying an adhesive to a surface of a second wafer to form an adhesive coated wafer; bonding the release layer coated wafer and the adhesive coated wafer together to form a bonded wafer system; performing at least one wafer processing operation (e.g., wafer grinding, etc.) on one of the first wafer and second wafer to form a processed wafer system; debonding the processed wafer system by initiating separation between the release layer and the adhesive to obtain a thin processed wafer; and cleaning the surface of the thin processed wafer with an organic solvent that is capable of dissolving the release layer or any residue thereof. Several examples of such an organic solvent include propylene glycol monomethyl ether acetate (PGMEA), butyl acetate, toluene, xylene, and mesitylene.

According to another aspect of the present disclosure, the method comprises the steps of applying a release layer to the surface of a first wafer to form a release coated wafer, followed by the application of an adhesive to the surface of the release coated wafer to form an adhesive/release coated wafer. The adhesive/release coated wafer is then bonded with a second carrier wafer to form the bonded wafer system. At least one wafer processing operation (e.g., wafer grinding, etc.) may be performed on one of the first wafer and second carrier wafer in the bonded wafer system to form the processed wafer system. The processed wafer system may then be debonded by initiating separation between the release layer and the adhesive to obtain a thin processed wafer. Finally, the surface of the thin processed wafer may be cleaned with an organic solvent that is capable of dissolving the release layer or any residue thereof.

According to yet another aspect of the present disclosure, the method comprises the steps of applying a release layer to the surface of both a first wafer and a second wafer to form a first release coated wafer and a second release coated wafer. An adhesive is applied to the surface of at least one of the first release coated wafer or the second release coated wafer to form an adhesive/release coated wafer. The adhesive/release coated wafer is then bonded with the remaining release coated wafer to form a bonded wafer system. At least one wafer processing operation (e.g., wafer grinding, etc.) may be performed on one of the first wafer and second carrier wafer to form a processed wafer system. The processed wafer system may be debonded by initiating separation between one of the release layers and the adhesive to obtain a thin processed wafer. If the separation occurs between the adhesive and the release layer adjacent to thin processed wafer, the surface of the thin processed wafer may be cleaned with an organic solvent that is capable of dissolving the release layer or any residue thereof. If the separation occurred between the adhesive and the release layer adjacent to the carrier wafer, the adhesive layer is removed from the release layer adjacent the processed wafer by peeling, or any other mechanical means known to one skilled in the art prior to the surface of the processed wafer being cleaned.

The release layer comprises either a silsesquioxane-based resin or a thermoplastic resin and is capable of withstanding exposure up to about 180° C. without the occurrence of substantial cross-linking. The adhesive is a polysiloxane-based composition that includes a vinyl-functionalized oligomeric resin, a Si—H functional oligomeric resin, a catalyst, and optionally an inhibitor. The release layer is not miscible with the adhesive. The method may further comprise the step of prebaking the adhesive coated wafer at a temperature between about 90 to about 110° C.

According to another aspect of the present disclosure, a bonding system is provided that can be used to temporarily bond a support wafer to a semiconductor wafer in order to facilitate wafer processing operations. The bonding system generally comprises a first wafer and a second wafer; a release layer applied to a surface of the first wafer in which the release layer is soluble in an organic solvent; and an adhesive applied to a surface of the second wafer. Although the adhesive is immiscible with the release layer, the adhesive and release layer can be temporarily bonded together and then debonded.

The adhesive in the bonding system comprises a vinyl-functionalized oligomeric resin, a Si—H functional oligomeric resin, and a catalyst. The vinyl-functionalized resin includes at least one of three siloxane components, C1, C2, and C3, according to the formula $E(C1)_a(C2)_b(C3)_cE$, where E represents endcapping groups and a, b, and c represent the mole percent of each component in the resin with a ranging between about 0.025 to 1.0; b being greater than 0.0 up to about 0.95, alternatively b may be 0.0; and c being greater than 0.0 up to about 0.60, alternatively c may be 0.0.

The endcapping groups, E, and the siloxane components C1, C2, and C3 in the vinyl-functionalized resin are further defined by the formula:

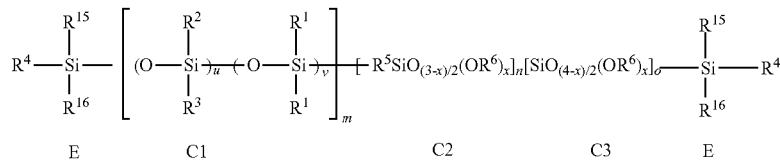

In which $R^1$, $R^2$, $R^3$, $R^4$, $R^5$, $R^{15}$, and $R^{16}$ are independently selected organic groups with at least one of $R^2$, $R^3$, $R^4$, $R^{15}$, and $R^{16}$ being an aliphatic or aromatic group that includes vinyl functionality; $R^6$ is a hydrogen atom or a hydrocarbon group having from 1 to 4 carbon atoms; the subscript v is within the range from 0 to 1, while the subscript u is within the range from 0 to 2; and the degree of polymerization for each component, m, n, and o, are predetermined as integers selected such that the corresponding component exhibits the desired properties to adequately function in the adhesive composition. Alternatively, at least one of the selected $R^2$, $R^3$, $R^4$, $R^{15}$, and $R^{16}$ groups is a fluorinated moiety. One skilled-in-the-art will understand that component C3 may be a functionalized silica particle when desired.

The Si—H functional resin is defined by the formula:

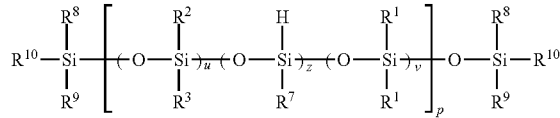

In which the subscript v is within the range from 0 to 1, the subscript u is within the range from 0 to 2, and the subscript z is within the range of 0 to 1; and $R^1$, $R^2$, $R^3$, $R^7$, $R^8$, $R^9$, and $R^{19}$ are organic groups that optionally include fluorinated functionality with at least one of $R^9$, $R^{10}$, and $R^{11}$ being a hydrogen atom when the sum of (u+v+z) is 0. The degree of polymerization, p, is predetermined as an integer selected such that the Si—H functional resin exhibits the desired properties to adequately function in the adhesive composition. The catalyst may be any thermal-activated or photo-activated catalyst capable of facilitating a hydrosilylation reaction.

The release layer in the bonding system comprise a thermoplastic resin or a resin having at least one of three siloxane units according to the formula $(U1)_d(U2)_e(U3)_f$, in which d, e, and f represent the mole percent of each component in the resin with d ranging between about 0.025 to 1.0; e being greater than 0.0 up to about 0.95, alternatively e is 0.0; and f being greater than 0.0 up to about 0.30, alternatively f is 0.0. The units, U1, U2, and U3 in the resin are defined by the formula:

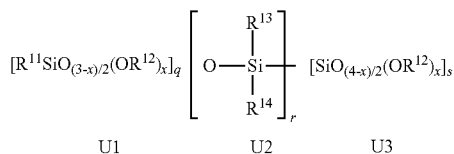

$$[R^{11}SiO_{(3-x)/2}(OR^{12})_x]_q \quad \left[O-\underset{R^{14}}{\overset{R^{13}}{\underset{|}{\overset{|}{Si}}}}-\right]_r \quad [SiO_{(4-x)/2}(OR^{12})_x]_s$$

$$\text{U1} \qquad\qquad \text{U2} \qquad\qquad \text{U3}$$

In which $R^{11}$, $R^{13}$, and $R^{14}$ are organic groups; $R^{12}$ is a group selected as one from a hydrogen atom or a hydrocarbon group containing between 1 to 4 carbon atoms; the value of x is 0, 1, or 2; and the values for the degree of polymerization for each unit, q, r, and s, are predetermined as integers selected such that the corresponding unit exhibits the desired properties to adequately function in the release layer.

The catalyst in the bonding system is one selected from the group of chloroplatinic acid, a platinum-containing catalyst obtained by reacting chloroplatinic acid or platinum dichloride with an aliphatically unsaturated organosilicon compound, a platinum(0)-1,3-divinyl-1,1,3,3-tetramethyldisiloxane complex, platinum acetyl-acetonate, and any other transition metal catalyst used in hydrosilylation reactions.

According to another aspect of the present disclosure, the adhesive in the bonding system may further comprise an inhibitor that is capable of interacting with the catalyst in order to delay the initiation of the catalyzed reaction. The inhibitor may be selected as one from the group of diallyl maleate, ethynyl cyclohexanol, bis-2-methoxy-1-methylethylmaleate, and N,N,N',N'-tetramethylethylenediamine.

Further areas of applicability will become apparent from the description provided herein. It should be understood that the description and specific examples are intended for purposes of illustration only and are not intended to limit the scope of the present disclosure.

BRIEF DESCRIPTION OF THE DRAWINGS

The drawings described herein are for illustration purposes only and are not intended to limit the scope of the present disclosure in any way.

DETAILED DESCRIPTION

Figure 1:
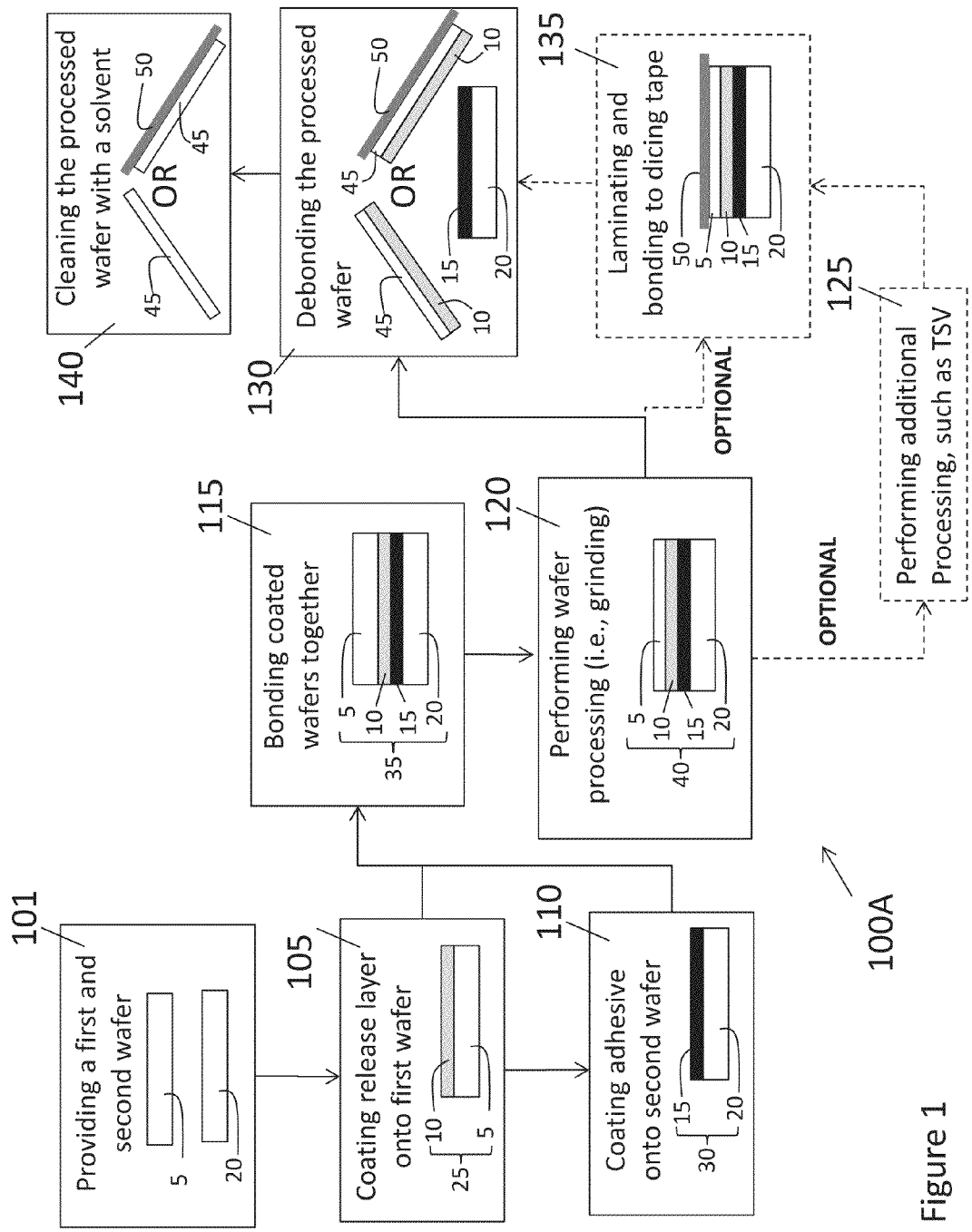
FIG. 1 is a schematic representation of a bonding system and a method used to treat the surface of a semiconductor wafer in order to enhance handling of the wafer during subsequent processing operations according to one aspect of the present disclosure.

The following description is merely exemplary in nature and is in no way intended to limit the present disclosure or its applications or uses. It should be understood that throughout the description and drawings, corresponding reference numerals indicate like or corresponding parts and features.

The present disclosure generally provides materials and processes for the treatment of wafers used in the production of semiconductor products. More specifically, this disclosure relates to the preparation of adhesive and release layer compositions and their use in forming a temporary bond when used as part of a bonding system. The temporary adhesive compositions are silicone-based thermosetting materials and the release layer compositions are silsesquioxane-based materials or thermoplastic materials.

The silicone-based adhesive and the silsesquioxane-based or thermoplastic-based release layer may be applied to the surface of a semiconductor wafer or a support wafer through the use of conventional coating techniques, such as spin coating, spray coating, flow coating, or the like. Temporary bonding between the adhesive and the release layer is induced in order to facilitate handling of the semiconductor wafer through subsequent wafer grinding, TSV, or other processing steps. Upon completion of the desired processing, the semiconductor wafer can be separated from the support wafer by occurrence of de-bonding between the adhesive and the release layer. This de-bonding step with respect to the use of a silsesquioxane-based release layer involves dissolving the silsesquioxane material in an organic solvent.

One example of a bonding process, among others, that uses the teachings of the present disclosure involves coating the temporary adhesive onto a support wafer, followed by pre-baking the coated wafer at a predetermined temperature, which is below the cure temperature for the adhesive composition. The silsesquioxane-based or thermoplastic-based release material is coated onto the patterned surface of a semiconductor wafer. Subsequently, the two wafers are bonded together by baking at a temperature and for a length of time that is sufficient to cure the adhesive. After completion of any desired processing steps (e.g., wafer grinding, TSV, etc.), the bonded wafers can be de-bonded by initiation of separation between the release layer and the adhesive. The wafer can also be cleaned upon exposure of the release layer to an organic solvent in which the release layer is soluble.

The bonding and de-bonding process of the present disclosure, as well as the composition of the adhesive and release layer provide multiple benefits when used in the fabrication of semiconductor devices that incorporate thin wafer technology. The composition of the adhesive and release layer, the ability to coat the adhesive and release layer onto wafers using conventional techniques, the simple bonding process using thermal-activated or UV-activated curing, the simple mechanical de-bonding process, and the cleaning process of exposing the surface of the wafer to an organic solvent provide for overall lower manufacturing costs and down-time, as well as enhanced process throughput, yield, and productivity.

According to one aspect of the present disclosure a bonding system is provided that is used to temporarily bond a support wafer to a semiconductor wafer in order to facilitate wafer processing operations. This bonding system generally comprises a first wafer and a second wafer; a release layer located adjacent to a surface of the first wafer; and a silicone-based adhesive located adjacent to a surface of the second wafer, such that these release layer and adhesive are sandwiched between the two wafers. The adhesive and release layer may be temporarily bonded together and debonded. Although the release layer is soluble in an organic solvent, the release layer and the adhesive are immiscible with each other.

According to another aspect of the present disclosure the bonding system may comprise a first wafer and a second wafer; a release layer located adjacent to the first wafer; and a second release layer located adjacent to the second wafer; the release layers being soluble in an organic solvent. A silicone-based adhesive is located between the release layers; the adhesive being immiscible with the release layers. The adhesive and release layers are capable of being temporarily bonded together and debonded.

The silicone-based adhesive generally comprises a vinyl-functionalized polysiloxane oligomeric resin, a Si—H functional polysiloxane oligomeric resin, and a catalyst. The catalyst may be either thermal-activated or UV-activated. Optionally, the silicone-based adhesive may also include an inhibitor that can interact with the catalyst in order to delay the initiation of the catalyzed reaction. When desirable, the adhesive may be dispersed in a solvent in order to control the thickness of the adhesive layer that is applied to the surface of the wafer. Typical solvents that can be used include any solvent known to one skilled-in-the-art that can dissolve polydimethylsiloxane, including, but not limited to, disiloxane and trisiloxane solvents, as well as aliphatic or aromatic solvents.

The vinyl-functionalized polysiloxane oligomeric resin comprises at least one of three siloxane components, C1, C2, and C3 described according to the formula $E(C1)_a(C2)_b(C3)_c E$, where E represents endcapping groups and a, b, and c represent the mole percent of each component in the resin. The value for a may range between about 0.025 to 1.0; the value for b may be greater than 0.0 up to about 0.95, alternatively the value for b may be 0.0; and the value for c may be greater than 0.0 up to about 0.60, alternatively the value for c may be 0.0.

The endcapping groups, E, and the siloxane components C1, C2, and C3 in the vinyl-functionalized resin are further defined by the formula:

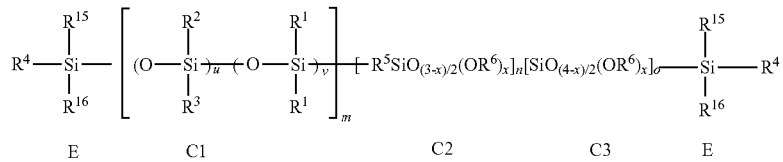

In which each $R^1$, $R^2$, $R^3$, $R^4$, $R^{15}$, and $R^{16}$ represents an organic group that is independently selected as one from a methyl group, ethyl group, propyl group, hexyl group, cyclohexyl group, phenyl group, vinyl group, hexenyl group, methacryloxypropyl group, acryloxypropyl group, and any other organic group that optionally includes a fluorinated moiety having from 1 to 8 carbon atoms. However, at least one of $R^2$, $R^3$, $R^4$, $R^{15}$, and $R^{16}$ is an aliphatic or aromatic group that includes vinyl functionality. Alternatively, at least one of $R^2$, $R^3$, $R^4$, $R^{15}$, and $R^{16}$ is a fluorinated moiety. Several examples of fluorinated moieties include, but are not limited to, a trifluoropropyl group, a pentafluorobutyl group, and a nonafluorohexyl group, among others. In component, C1, the subscript v is any number ranging between 0 and 1, while the subscript u is any number ranging between 0 and 2. In Components, C2 and C3, the subscript x has a value of 0, 1, or 2. The subscripts u and v are used to describe the ratio between the $(R^2R^3SiO_{2/2})$ and $(R^1R^1SiO_{2/2})$ moieties present in the backbone of component, C1. The subscripts u and v may alternatively be described by the relationship $0 \leq (u+v) \leq 3$. The $R^5$ represents an organic group, such as a methyl group, ethyl group, vinyl group, phenyl group, or another aliphatic or aromatic group having 1-12 carbons, or a combination thereof. The $R^6$ represents a hydrogen atom or a hydrocarbon group having from 1 to 4 carbon atoms. The values for the degree of polymerization of each component, m, n, and o, are predetermined as integers with m being greater than zero and each integer selected such that the components, C1, C2, and C3, exhibit the desired properties to adequately function in the adhesive composition according to the teachings of the present disclosure. In certain embodiments of the present disclosure, at least one of the components, C2 and C3, exhibits a degree of polymerization, n and/or o, having a value greater than zero.

The Si—H functional polysiloxane oligomeric resin (SiHR) is further defined by the formula shown below in which the subscript v is any number ranging between 0 and 1, the subscript u is any number ranging between 0 and 2, and the subscript z is any number ranging between 0 and 1. The subscripts u, v, and z are used to describe the ratio between the $(HR^7SiO_{2/2})$ $(R^2R^3SiO_{2/2})$, and $(R^1R^1SiO_{2/2})$ moieties present in the backbone of the polysiloxane oligomeric resin. The subscripts u, v, and z may alternatively be described by the relationships $0 \leq u \leq 2$, $0 \leq v \leq 1$, and $0 \leq z \leq 1$. The $R^1$ is an organic group as described above. The $R^2$, $R^3$, and $R^7$ represent organic groups that are independently selected as one from a hydrogen atom, methyl group, ethyl group, propyl group, hexyl group, cyclohexyl group, phenyl group, and other non-vinyl containing organic groups that include a fluorinated moiety having from 1 to 8 carbon atoms. Alternatively, at least one of $R^2$, $R^3$, and $R^7$ is a fluorinated moiety. The $R^8$, $R^9$, and $R^{10}$ represent organic groups that are independently selected as one from a hydrogen atom, methyl group, ethyl group, propyl group, hexyl group, cyclohexyl group, phenyl group, and other non-vinyl containing organic groups that include a fluorinated moiety having from 1 to 8 carbon atoms with at least one of the $R^8$, $R^9$, and $R^{10}$ groups comprising a hydrogen atom (i.e., a Si—H bond) when the sum of the subscripts u+v+z is 0. The value of the degree of polymerization, p, is predetermined as a non-zero integer selected such that the Si—H functional oligomeric resin exhibits the desired properties to adequately function in the adhesive composition according to the teachings of the present disclosure.

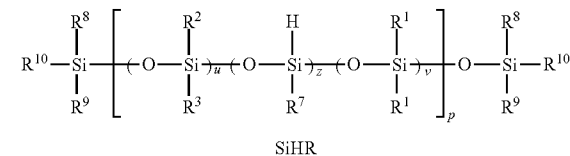

SiHR

The amount of the vinyl-functionalized and Si—H functionalized polysiloxane oligomeric resins present in the adhesive may be defined according to the molar ratio of the vinyl-functionalized resin to the Si—H functionalized resin that is present in the formulation. Typically, the molar ratio of the vinyl:Si—H resin present in the adhesive is between about 0.1 to about 4.0 with a ratio of about 0.5 to about 2.5 alternatively being used when desirable.

The thermal-activated or UV-activated catalyst may comprise any catalyst known to one skilled-in-the-art to be useful in catalyzing a hydrosilylation reaction. The catalyst may be a transition metal group-containing catalyst. By definition, a transition metal includes, but is not limited to, ruthenium, rhodium, palladium, osmium, iridium and platinum metals, as well as any mixtures or complexes thereof. The transition metal catalyst may comprise solid or hollow particles, a metal layer deposited on a carrier such as silica gel or powdered charcoal, or an organometallic compound or complex containing the transition metal. Several examples of transition metal-containing catalysts include chloroplatinic acid, either in hexahydrate form or anhydrous form, a platinum-containing catalyst obtained by reacting chloroplatinic acid or platinum dichloride with an aliphatically unsaturated organosilicon compound, a platinum(0)-1,3-divinyl-1,1,3,3-tetramethyldisiloxane complex, and platinum acetylacetonate.

The appropriate amount of the catalyst used in the adhesive is predetermined upon the selection of the specific catalyst used. The platinum catalyst is present in an amount sufficient to provide at least 2 parts per million (ppm) of platinum in the adhesive. Alternatively, the amount of catalyst present in the adhesive is on the order of about 5 ppm to about 2000 ppm. The catalyst may be added as a single catalyst species or as a mixture of two or more different species.

The inhibitor may be any material that is known to one skilled-in-the-art capable of being capable of inhibiting the activity of the catalyst. In other words, the inhibitor is a material that retards or prevents the catalyst from functioning as a catalyst. According to one aspect of the present disclosure the inhibitor may retard catalyst activity at room temperature but will not interfere with the properties of the catalyst at elevated temperatures. The inhibitor may include, but is not limited to, ethylenically or aromatically unsaturated amides, acetylenic compounds, silylated acetylenic compounds, ethylenically unsaturated isocyanates, olefinic siloxanes, unsaturated hydrocarbon monoesters and diesters, hydroperoxides, nitriles, and diaziridines. Several specific examples, among many examples, of inhibitors include diallyl maleate, ethynyl cyclohexanol, bis-2-methoxy-1-methylethylmaleate and N,N,N',N'-tetramethylethylenediamine. Generally, the inhibitor will be added to the adhesive, such that the mole ratio of the catalyst:inhibitor is between about 1 to about 200 with a ratio of about 7 to about 11 being alternatively used when desirable.

According to another aspect of the present disclosure, a release layer is provided as part of the bonding system in which the layer is formed from one selected from a silsequioxane-based resin and a thermoplastic material. Several examples of a release layer composition comprising a thermoplastic material includes polysulfone, polyimide, and polyetherketone, among others, that can be dissolved in common solvents, such as N-methylpyrrolidinone and N,N-dimethylacetamide. A release layer composition comprising a silsesquioxane-based resin includes at least one of three siloxane units, U1, U2, and U3 described according to the formula $(U1)_d(U2)_e(U3)_f$, where d, e, and f represent the mole percent of each component in the resin. The value for d may range between about 0.025 to 1.0; the value for e being greater than 0.0 up to about 0.95, alternatively e is 0.0; and f being greater than 0.0 up to about 0.30, alternatively f is 0.0.

The units, U1, U2, and U3 in the resin of the release coating are defined by the formula:

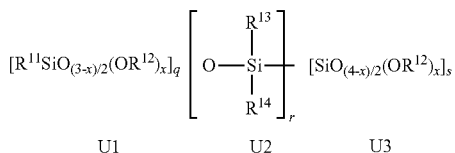

in which $R^{11}$ represents an organic group selected as one from a hydrogen atom, methyl group, ethyl group, propyl group, phenyl group, trifluoromethyl group, any other organic groups containing 1 to 20 carbon atoms, including fluorinated organic groups, and any combination thereof. The $R^{12}$ represents a group selected as one from a hydrogen atom or a hydrocarbon group containing between 1 to 4 carbon atoms. The $R^{13}$ and $R^{14}$ represent organic groups independently selected as one from a, hydrogen atom, methyl group, ethyl group, propyl group, hexyl group, cyclohexyl group, phenyl group, vinyl group, hexenyl group, methacryloxypropyl group, acryloxypropyl group and any other organic group that includes a fluorinated moiety having from 1 to 8 carbon atoms. The value of x may be 0, 1, or 2, while the values for the degree of polymerization for each unit, q, r, and s, are predetermined as integers with q being greater than zero and each integer selected such that the siloxane units, U1, U2, and U3, exhibit the desired properties to adequately function in the release layer according to the teachings of the present disclosure. In certain embodiments of the present disclosure, at least one of the units, U2 and U3, exhibits a degree of polymerization, r and/or s, having a value greater than zero.

According to another aspect of the present disclosure, a method 100A of using the adhesive and the release layer for providing a temporary bond between a first and second wafer in order to perform at least one processing operation to form a processed wafer, debonding the wafers, and subsequently cleaning the processed wafer is provided as shown in FIG. 1. This method generally comprises providing 101 a first wafer 5 and a second wafer 20 for subsequent coating. The release layer 5 is coated 105 onto the surface of the first wafer 10 to form a release layer coated wafer 25. The release layer 5 may be coated 105 using conventional techniques known to one skilled-in-the-art, including but not limited to, spin coating, spray coating, flow coating, and the like. Similarly, the adhesive 15 is coated 110 onto the surface of the second wafer 20 using conventional techniques to form an adhesive coated wafer 30. One skilled-in-the-art will understand that the first 10 and second 20 wafers may be selected as one from the group of a support wafer or a wafer upon which subsequent processing will be performed, such as a patterned wafer. The first 10 and second 20 wafers are different from one another. The adhesive coated wafer 30 may be prebaked at a temperature in the range of about 70 to about 140° C. in order to thermoset the adhesive. Alternatively, a temperature range of 90 to 110° C. may be used when desirable. The release layer coated wafer 25 may be prebaked at a temperature in the range of about 80 to about 140° C. with a temperature range of about 100 to about 120° C. alternatively being used when desired.

The adhesive coated wafer 30 and the release layer coated wafer 25 are then bonded 115 together by placing the adhesive in contact with the release layer to form a bonded wafer system 35. The coated wafers 25, 30 may be bonded by curing in a vacuum oven at a predetermined reduced pressure and temperature level or in a conventional oven at a higher temperature when the catalyst in the adhesive is thermal-activated. If the catalyst in the adhesive is photo-activated, the coated wafers 25, 30 may be bonded upon exposure to ultraviolet (UV) radiation with further cure possible upon exposure to an elevated temperature. In this case, at least one of the wafers is a glass wafer or UV transparent wafer in order to UV-cure the adhesive.

In the bonded wafer system 35, the support wafer provides the necessary support to the patterned wafer in order for subsequent operations or processes, such as wafer grinding, among others to be performed. Still referring to FIG. 1, wafer processing 120 is performed on the patterned wafer identified for illustration only as the first wafer 10 to form a processed wafer system 40. Once the patterned wafer is processed into a very thin wafer, additional processes 125, such as through-silicon via (TSV), may be optionally performed on the processed wafer system 40 when desired.

The processed wafer system 40 can be mechanically debonded 130 by initiating an indentation with a sharp knife, such as a razor blade, at the edge of the interface between the release layer 5 and the adhesive 15. The separation of the release layer from the adhesive leads to the formation of a thin processed wafer 45. In the bonded wafer system 35, the adhesive layer 15 is used to support the patterned wafer. The release layer 5 is used to promote debonding in the processed wafer system 40 when the grinding and any subsequent processing is completed.

Optionally, in order to handle and use the thin processed wafer 45 after being debonded and cleaned, the back-side surface of the processed wafer 45 may be laminated or permanently bonded 135 to dicing tape 50. The back-side surface of the processed wafer 45 is defined as the side of the wafer that is not in contact with either the release layer 5 or the adhesive 15. The lamination or bonding to the dicing tape 50 may be performed prior to exposing the process wafer system 40 to the debonding 130 and cleaning 140 steps.

The processed wafer 45 may then be exposed 140 to an organic solvent that will act as a surface cleaning agent. The release layer 5 or any residue thereof can be removed from the processed wafer 45 by spraying a solvent on to the wafer or by soaking the wafer in an organic solvent in which the release layer is soluble. The organic solvent also cleans the surface of the wafer 10 upon which the release layer was coated. Any organic solvent can be used to clean the processed wafer 45 provided that the solvent is capable of dissolving the release layer 5 and can meet any necessary regulatory requirements. Several examples of an organic solvent include but are not limited to, toluene, xylene, mesitylene, propylene glycol methyl ether acetate (PGMEA), and butyl acetate.

Figure 2:
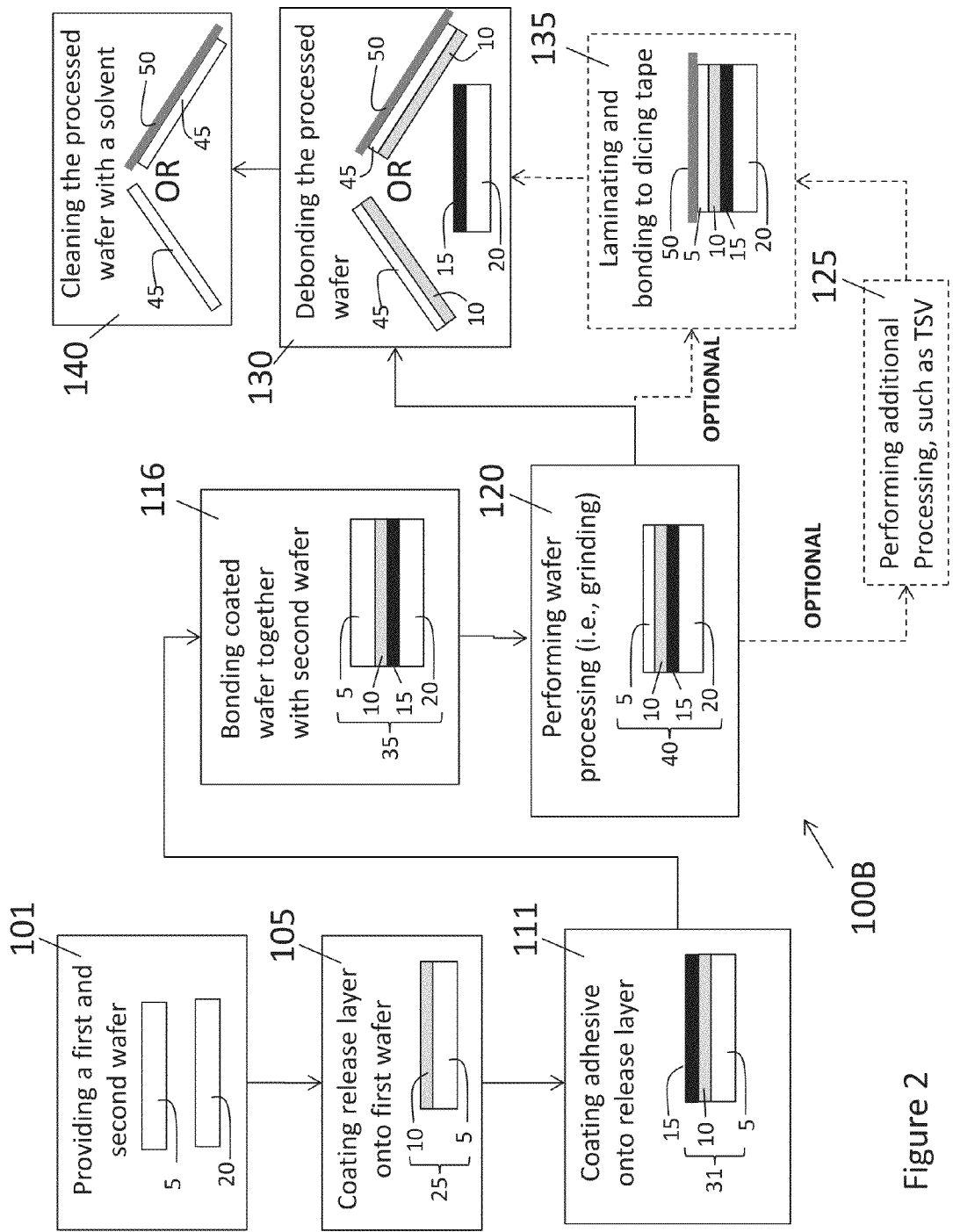
FIG. 2 is a schematic representation of a bonding system and method used to treat the surface of a semiconductor wafer in order to enhance handling of the wafer during subsequent processing operations according to another aspect of the present disclosure.
Figure 3:
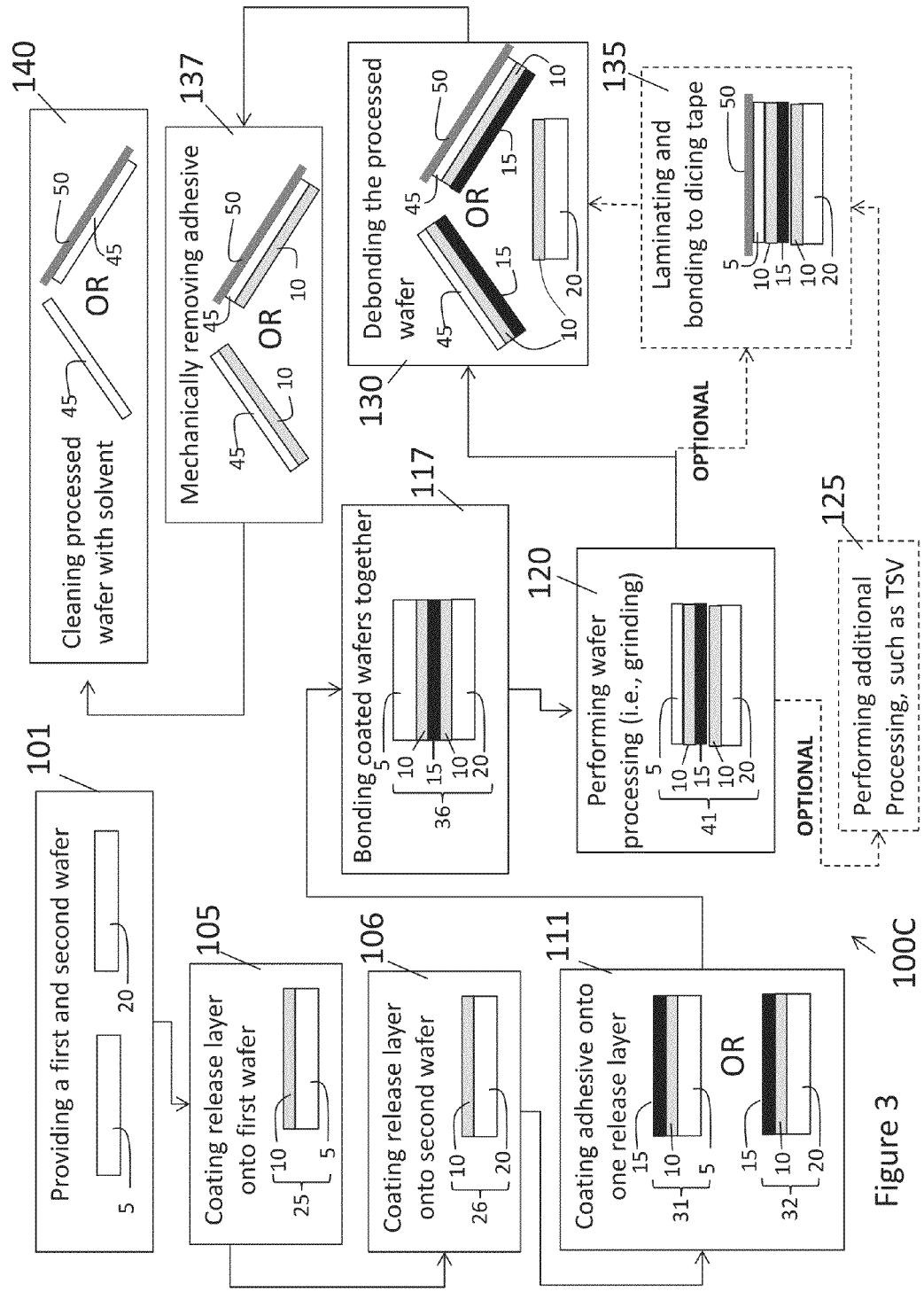
FIG. 3 is a schematic representation of a bonding system and method used to treat the surface of a semiconductor wafer in order to enhance handling of the wafer during subsequent processing operations according to yet another aspect of the present disclosure.

One skilled in the art will understand that the method 100A may be modified to allow the adhesive to be applied to the release layer coated wafer prior to bonding to a second uncoated wafer or another release layer coated wafer as shown in FIGS. 2 and 3. Referring now to FIG. 2, such a variant of method 100A is shown (see FIG. 1) in the form of method 100B. Method 100B is different than method 100A in that the adhesive 15 is applied 111 to the surface of the release layer 10 on the first wafer 5 to form an adhesive/release layer coated wafer 31. The second wafer 20 is then bonded 116 together with the adhesive/release layer coated wafer 31 to form the bonded wafer system 35. The subsequent processing 120, debonding 120, and cleaning 140 steps, as well as the optional inclusion of steps related to performing 125 additional processing operations and laminating/bonding the processed wafer to dicing tape may be conducted on the bonded wafer system 35 in a manner that is similar to that previously described in method 100A

Referring now to FIG. 3, an example of a variation of method 100B is provided in the form of method 100C. This method generally comprises providing 101 a first wafer 5 and second wafer 20; the wafers 5, 20 being uncoated. A release layer 10 is coated 105 onto the first wafer 5 and a second release layer 10 is coated 106 onto the second wafer 20 forming two release layer coated wafers 25, 26. An adhesive 15 is then applied 111 to one of the release layer coated wafers 25, 26 forming an adhesive/release layer coated wafer 31, 32. The adhesive/release layer coated wafer 31, 32 is temporarily bonded 117 to the remaining release layer coated wafer 25, 26 to form a bonded wafer system 36. A wafer processing operation, such as grinding, may be performed 120 on one of the wafers 5, 20 in the bonded wafer system 36 to form a processed wafer system 41.

Still referring to FIG. 3, after completion of this wafer processing 120 and any subsequent optional processes, such as performing 125 additional processing (i.e., TSV) and laminating/bonding the processed wafer system 41 to dicing tape, the wafers 5, 20 may be debonded 130 from one another by separating one of the release layers 10 from the adhesive 15. The processed wafer 45 may be exposed 140 to an organic solvent that will act as a surface cleaning agent. The release layer 5 or any residue thereof can be removed from the processed wafer 45 by spraying a solvent on to the wafer or by soaking the wafer in an organic solvent in which the release layer is soluble. One skilled in the art will understand that if the adhesive 15 separates from the release layer adjacent to the carrier wafer as shown in FIG. 3, the adhesive may be mechanically removed 137 from the release layer adjacent to the processed wafer 45 prior to performing the solvent cleaning 140.

The following specific examples are given to illustrate the disclosure and should not be construed to limit the scope of the disclosure. Those skilled-in-the-art, in light of the present disclosure, will appreciate that many changes can be made in the specific embodiments which are disclosed herein and still obtain alike or similar result without departing from or exceeding the spirit or scope of the disclosure.

Example 1

Preparation of Si—H Functionalized Resin with a Catalyst

This example demonstrates the preparation of a Si—H functionalized polysiloxane oligomeric resin according to the teachings of the present disclosure in which a catalyst is also dispersed. A total of 244 milligrams of N,N,N',N'-tetramethylethylenediamine is mixed with 87 milligrams of platinum (0)-1,3-divinyl-1,1,3,3-tetramethyldisiloxane complex solution in a siloxane solvent (22 milligrams Pt) at room temperature for an hour. Then, 130.35 grams of a polymethylhydrogensiloxane-co-polydimethylsiloxane copolymer (F1-3546 Polymer, Dow Corning Corp., Midland, Mich.) and 79.8 grams of another polymethylhydrogensiloxane-co-polydimethylsiloxane copolymer (6-3570 Polymer, Dow Corning Corp.) are added to the above platinum catalyst solution. The mixture is stirred for 24 hours at room temperature.

Example 2

Preparation of Adhesive Composition

This example demonstrates the preparation of an adhesive composition according to the teachings of the present disclosure. A total of 16.30 grams of the stored mixture of Example 1 is added to a three-neck 250 ml round-bottomed flask equipped with a mechanical stir shaft and a nitrogen inlet/outlet. Then 100 grams of a mixture of a vinyl-terminated polydimethylsiloxane oligomer (SFD-119, Dow Corning Corporation) and a vinyl-functionalized silica (6-3444, Dow Corning Corporation) is slowly added to the flask while stirring. The mixture is stirred for 2 hours and then transferred to a plastic bottle for future use.

Example 3

Second Preparation of Adhesive Composition

This example demonstrates the preparation of a second adhesive composition according to the teachings of the present disclosure. A total of 2.314 grams of the stored mixture of Example 1 is added to a three-neck 250 ml round-bottomed flask equipped with a mechanical stir shaft and a nitrogen inlet/outlet. Then 100 grams of a vinyl terminated polydiemthylsiloxane oligomer (SFD-120, Dow Corning Corporation) is slowly added to the flask while stirring. The mixture is stirred for 2 hours and then transferred to a plastic bottle for future use.

Example 4

Preparation of Methylsilsesquioxane Release Layer

This example demonstrates the preparation of a silsesquioxane-based release layer according to the teachings of the present disclosure. A total of 316 grams of concentrated HCl (molar ratio of HCl:H2O is 3.12 mol/11.2 mol), 689 grams of toluene, and 2 grams of octylsodium sulfate are added to a 3-L jacketed-round-bottomed flask equipped with a mechanical stir shaft, a condenser, and a nitrogen inlet and outlet to form an aqueous HCL/toluene suspension. The aqueous HCl/toluene suspension is stirred at 600 rpm to dissolve the octylsodium sulfate surfactant while maintaining the reaction temperature at 20° C.

A total of 200 grams of toluene (2.17 mol) and 149.5 grams of methyltrichlorosilane (1.0 mol) are added together in another round-bottomed flask at a rate of 1.46 grams per minute. Under a nitrogen atmosphere, the methyltrichlorosilane/toluene solution is added to the HCl/toluene suspension over a period of 4 hours. Then, the mechanical stirring is stopped in order to allow phase separation to occur. Phase separation occurs in about 2 minutes. The upper organic toluene layer, which contains the crude methylsilsesquioxane phase, is separated from the lower concentrated HCl layer. The HCl layer is removed.

The organic toluene layer is washed with 200 ml of deionized water at a stirring rate of 300 rpm for 1 minute. The mechanical stirring is stopped for 5 minutes, and the water layer containing residual HCl and surfactant is removed. This wash process was repeated 5 times until the pH value of the washed water was about 4. Subsequently, 80 grams (1.7 moles) of ethanol is added to the organic toluene layer while stirring, which causes the layer to become clear. The solution is stirred for about 5 minutes. Finally, the translucent solution is transferred to a pear-shaped flask and the toluene solvent, ethanol, and residual HCl are stripped-off using a rotary evaporator at 40° C., leaving the crude methylsilsesquioxane resin. The crude resin is allowed to further vacuum dry overnight. The crude resin is then dissolved in butyl acetate at about 7 wt. %, filtered, and stored for future use.

Example 5

Preparation of Phenylsilsesquioxane Release Layer

This example demonstrates the preparation of another silsesquioxane-based release layer according to the teachings of the present disclosure. A total of 503.4 grams (2.54 moles) of phenyltrimethoxysilane and 0.36 grams of trifluoromethanesulfonic acid (triflic, acid) is added to a 1 liter, 3-neck round-bottomed flask equipped with a mechanical stir shaft, a thermometer, a Dean-Stark trap, a condenser, and a nitrogen inlet and outlet. While the mixture is stirred at 200 rpm, a total of 137.2 g (7.62 moles) of water is added slowly over 15 minutes to ensure that the reaction mixture temperature does not exceed 50° C. Then, the reaction mixture is refluxed at 75° C. for 90 minutes. The methanol and some water are removed through the Dean-Stark trap. After the temperature is raised to 80° C., about 233 grams of liquid is removed. Subsequently, the reaction mixture is cooled to about 60° C. and 317 grams of toluene and 1.54 grams of 50 wt. % KOH aqueous solution is added separately.

The reaction mixture is refluxed with water being removed via the Dean-Stark trap. After the temperature is raised to 113° C., about 300 grams of liquid is removed. After the mixture is refluxed for an additional 2 hours, the reaction mixture is cooled to 90° C. and 0.83 grams of acetic acid is added to the mixture. The reaction mixture is then cooled for another 30 minute and the salt that has formed is filtered through a glass fiber/Buchner funnel in order to separate and collect the salt. The solvent is then removed using a rotary evaporator and the release layer resin collected. The molecular weight of the resin is about 12,600 kg/mol with a ratio of weight average to number average molecular weight (Mw:Mn) measured to be about 3.08. The resin is dissolved in butyl acetate at 10 wt. %, filtered, and stored for future use.

Example 6

Wafer Bonding, Debonding, and Cleaning Process

About 5 ml of the adhesive produced in Example 2 or Example 3 is placed onto the surface of a 4" clean silicon wafer positioned on a Karl-Suss spin coating instrument. The thickness of the resulting coating may range between about 30 to about 100 micrometers depending upon the spin rate used to apply the coating. The wafer is prebaked at 90° C. for about one minute.

About 2 ml of the release layer resin produced in Example 4 or Example 5 is placed onto the surface of a 4" clean silicon or glass wafer positioned on a Karl-Suss spin coating instrument. The thickness of the resulting coating may range between about 150 to about 300 nanometers depending upon the spin rate used to apply the coating. The wafer is prebaked at 110° C. for about one minute.

The wafer coated with the adhesive is bonded to the wafer coated with the release coating in a vacuum at about 50 mbar. Then the bonded wafers are placed into an oven and baked at 130 to 150° C. for about 2 minutes. Depending on the processing requirements, the wafers are further treated at various temperatures ranging from about 150 to 250° C. for 1 hour to form a bonded wafer system.

Example 7

Testing of Bonded Wafer Systems with respect to DeBonding and Cleaning

The method of Example 6 was performed ten separate times to form bonded wafer systems (Run No.'s 1-10) according to the teachings of the present disclosure. Each bonded wafer system is subjected to a debonding test by inserting a razor blade into the wafer to initiate the debonding. Upon completion of the debonding, the wafers coated with the release layer resin are subjected to a solvent solubility test by washing the wafer with butyl acetate or propylene glycol methyl ether acetate (PGMEA). The process parameters used to form the bonded wafer systems in Run No.'s 1-10 and the results of the debonding and solubility testing conducted are provided in Table 1.

This example demonstrates that bonded wafer systems prepared according to the teachings of the present disclosure can be debonded (Run No.'s 1, 3, and 5-9) via the simple mechanical method described herein. After debonding, the surface of the wafer can be cleaned by exposing the surface to an organic solvent (Run No.'s 1, 3, 5-9). The post bonding temperature should be kept low enough to prevent substantial curing and cross-linking in the release layer and in the adhesive. For example, the release layer from Example 4 when used with the adhesive of Example 2 (Run No.'s 1-2) or the adhesive of Example 3 (Run No.'s 3-4) are successfully debonded when the post-bonding temperature exposure is 150° C. (Run No.'s 1 and 3), but not so when the post-bonding temperature is raised to 200° C. (Run No.'s 2 and 4). However, when the release layer of Example 5 is used with the adhesive of Example 2 (Run No.'s 5-7), the bonded wafer system can be debonded after exposure to a post-bonding temperature between 150° C. (Run No. 5) to 250° C. (Run No. 7). The results shown in Table 1 demonstrate that under the right selection of adhesive and release layer, the bonded wafers can be debonded after undergoing thin wafer processing operations.

TABLE 1

| Run No. | Release Layer | Release Layer Prebake Temperature (° C.) | Adhesive | Adhesive Layer Prebake Temperature (° C.) | Bonding Temperature (° C.) | Post Bonding Temperature Treatment for 1 hour (° C.) | Debonding Performed | Solubility of the Release Layer in Butyl Acetate in 1 Minute |
|---|---|---|---|---|---|---|---|---|
| 1 | Example 4 | 110 | Example 2 | 90 | 135 | 150 | Yes | Yes |
| 2 | Example 4 | 110 | Example 2 | 90 | 135 | 200 | No | N/A |
| 3 | Example 4 | 110 | Example 3 | 90 | 135 | 150 | Yes | Yes |
| 4 | Example 4 | 110 | Example 3 | 90 | 135 | 200 | No | N/A |
| 5 | Example 5 | 110 | Example 2 | 90 | 135 | 150 | Yes | Yes |
| 6 | Example 5 | 110 | Example 2 | 90 | 135 | 200 | Yes | Yes |
| 7 | Example 5 | 110 | Example 2 | 90 | 135 | 250 | Yes | Yes |
| 8 | Example 5 | 110 | Example 3 | 90 | 135 | 150 | Yes | Yes |
| 9 | Example 5 | 110 | Example 3 | 90 | 135 | 200 | Yes | Yes |
| 10 | Example 5 | 110 | Example 3 | 90 | 135 | 250 | No | Yes |

A person skilled in the art will recognize that the measurements described are standard measurements that can be obtained by a variety of different test methods. The test methods described in the examples represents only one available method to obtain each of the required measurements.

The foregoing description of various embodiments of the present disclosure has been presented for purposes of illustration and description. It is not intended to be exhaustive or to limit the present disclosure to the precise embodiments disclosed. Numerous modifications or variations are possible in light of the above teachings. The embodiments discussed were chosen and described to provide the best illustration of the principles included in the present disclosure and its practical application to thereby enable one of ordinary skills in the art to utilize the teachings of the present disclosure in various embodiments and with various modifications as are suited to the particular use contemplated. All such modifications and variations are within the scope of the present disclosure as determined by the appended claims when interpreted in accordance with the breadth to which they are fairly, legally, and equitably entitled.

What is claimed is:

1. A bonding system used to temporarily bond a support wafer to a semiconductor wafer in order to facilitate wafer processing operations; the bonding system comprising:

a first wafer and a second wafer;

a release layer located adjacent to a surface of the first wafer; the release layer being soluble in an organic solvent; and an adhesive located adjacent to a surface of the second wafer; the adhesive being immiscible with the release layer;

wherein the adhesive and release layer can be temporarily bonded and debonded;

wherein the adhesive comprises:

a vinyl-functionalized oligomeric resin; the vinyl-functionalized resin including at least one of three siloxane components, C1, C2, and C3, according to the formula $E(C1)_a(C2)_b(C3)_c E$, where E represents endcapping groups and a, b, and c represent the mole percent of each component in the resin with a ranging between about 0.025 to 1.0; b ranging between 0.0 to about 0.95; and c ranging between 0.0 to about 0.60;

a Si—H functional oligomeric resin; the Si—H functional resin defined by the formula $$R^{10}-\underset{R^9}{\overset{R^8}{Si}}-\left[-O-\underset{R^3}{\overset{R^2}{Si}}\right)_u \left(-O-\underset{R^7}{\overset{H}{Si}}\right)_z \left(-O-\underset{R^1}{\overset{R^1}{Si}}\right)_v -O-\underset{R^9}{\overset{R^8}{Si}}-R^{10}$$

in which the subscript v is any number ranging between 0 and 1, the subscript u is any number ranging between 0 and 2, and the subscript z is any number ranging between 0 and 1; $R^1$ is an organic group having from 1 to 8 carbon atoms optionally substituted with fluorine; $R^2$, $R^3$, $R^7$, $R^8$, $R^9$, and $R^{10}$ are organic groups independently selected as one from a hydrogen atom, and non-vinyl-containing organic groups having from 1 to 8 carbon atoms optionally substituted with fluorine, with at least one of $R^8$, $R^9$, and $R^{10}$ comprising a hydrogen atom when the sum of the subscripts (u+v+z) is 0; the degree of polymerization, p, is predetermined as a non-zero integer selected such that the Si—H functional resin exhibits the desired properties to adequately function in the adhesive; and a catalyst capable of facilitating a hydrosilylation reaction selected from the group of a thermal-activated catalyst and a photo-activated catalyst; and optionally an inhibitor that is capable of interacting with the catalyst in order to delay the initiation of the catalyzed reaction.

2. A method for treating the surface of a semiconductor wafer to enhance handling during processing, the method comprising the steps of:

providing a first wafer and a second wafer;
applying a release layer to a surface of a first wafer to form a release layer coated wafer;
applying an adhesive to a surface of a second wafer to form an adhesive coated wafer;
bonding the release layer coated wafer and the adhesive coated wafer together to form a bonded wafer system, wherein the bonded wafer system is the bonding system of claim 1;
performing at least one wafer processing operation on one of the first wafer and second wafer to form a processed wafer system;
debonding the processed wafer system by initiating separation between the release layer and the adhesive to obtain a thin processed wafer; and
cleaning the surface of the processed wafer with an organic solvent;
wherein the organic solvent is capable of dissolving the release layer; and optionally further comprises the step of prebaking the adhesive coated wafer at a temperature between about 90 to about 110° C.

3. The method of claim 2, wherein the release layer is one selected from the group of a silsesquioxane-based resin and a thermoplastic resin; the release layer capable of withstanding exposure up to about 180° C. without the occurrence of substantial cross-linking; and
the adhesive is a polysiloxane-based composition that includes a vinyl-functionalized oligomeric resin, a Si—H functional oligomeric resin, a catalyst and optionally an inhibitor;
wherein the release layer is not miscible with the adhesive.

4. The method of claim 3 wherein the thermoplastic material is one selected from the group of polysulfone, polyimide, and polyetherketone that can be dissolved in common solvents.

5. The method of claim 2, wherein the wafer processing operation is wafer grinding.

6. The method of claim 5, wherein a second processing operation is performed; the second processing operation being through-silicon via (TSV).

7. The bonding system of claim 1, wherein the endcapping groups, E, and the siloxane components C1, C2, and C3 in the vinyl-functionalized resin are further defined by the formula:

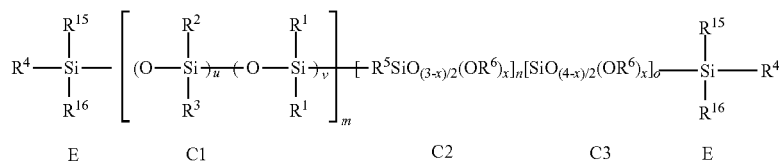

| E | C1 | C2 | C3 | E | in which the subscript v is any number ranging between 0 and 1, the subscript u is any number ranging between 0 and 2, and $R^1$, $R^2$, $R^3$, $R^4$, $R^{15}$, and $R^{16}$ are independently selected organic groups having from 1 to 8 carbon atoms optionally substituted with fluorine, with at least one of the selected $R^2$, $R^3$, $R^4$, $R^{15}$, and $R^{16}$ groups being an aliphatic or aromatic group that includes vinyl functionality when subscript v is 1; $R^5$ is an organic group is an aliphatic or aromatic group having 1-12 carbons, or a combination thereof; $R^6$ is a hydrogen atom or a hydrocarbon group having from 1 to 4 carbon atoms; the degree of polymerization for each component, m, n, and o, are predetermined as integers with m being greater than zero and each integer selected such that the corresponding component exhibits the desired properties to adequately function in the adhesive.

8. The bonding system of claim 7, wherein at least one of the degrees of polymerization, n and o, for components C2 and C3, respectively, is greater than zero.

9. A bonding system used to temporarily bond a support wafer to a semiconductor wafer in order to facilitate wafer processing operations; the bonding system comprising:
a first wafer and a second wafer;
a release layer located adjacent to a surface of the first wafer; the release layer being soluble in an organic solvent;
a second release layer located adjacent to a surface of the second wafer; the second release layer being soluble in an organic solvent;
an adhesive located adjacent to a surface of the first and second release layers; the adhesive being immiscible with the release layers;
wherein the adhesive and release layers can be temporarily bonded and debonded;
wherein the adhesive comprises:
a vinyl-functionalized oligomeric resin; the vinyl-functionalized resin including at least one of three siloxane components, C1, C2, and C3, according to the formula $E(C1)_a(C2)_b(C3)_cE$, where E represents endcapping groups and a, b, and c represent the mole percent of each component in the resin with a ranging between about 0.025 to 1.0; b ranging between 0.0 to about 0.95; and c ranging between 0.0 to about 0.60;
a Si—H functional oligomeric resin; the Si—H functional resin defined by the formula

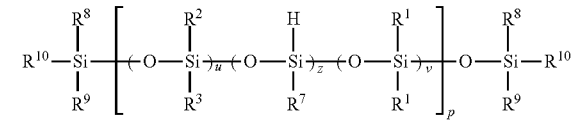

in which the subscript v is any number ranging between 0 and 1, the subscript u is any number ranging between 0 and 2, and the subscript z is any number ranging between 0 and 1; $R^1$ is an organic group having from 1 to 8 carbon atoms optionally substituted with fluorine; $R^2$, $R^3$, $R^7$, $R^8$, $R^9$, and $R^{10}$ are organic groups independently selected as one from a hydrogen atom, and non-vinyl-containing organic groups having from 1 to 8 carbon atoms optionally substituted with fluorine, with at least one of $R^8$, $R^9$, and $R^{10}$ comprising a hydrogen atom when the sum of the subscripts (u+v+z) is 0; the degree of polymerization, p, is predetermined as a non-zero integer selected such that the Si—H functional resin exhibits the desired properties to adequately function in the adhesive; and
a catalyst capable of facilitating a hydrosilylation reaction selected from the group of a thermal-activated catalyst and a photo-activated catalyst; and optionally
an inhibitor that is capable of interacting with the catalyst in order to delay the initiation of the catalyzed reaction.

10. A method for treating the surface of a semiconductor wafer to enhance handling during processing, the method comprising the steps of:
providing a first uncoated wafer and a second uncoated wafer;
applying a release layer to at least one of the first uncoated wafer and second uncoated wafer to form one or more release layer coated wafer;
applying an adhesive to the surface of one release layer coated wafer to form an adhesive/release layer coated wafer;
bonding the adhesive/release coated wafer together with the other release layer coated wafer or uncoated wafer to form a bonded wafer system, wherein the bonded wafer system is the bonding system of claim 8;
performing at least one wafer processing operation on one of the wafers in the bonded wafer system to form a processed wafer system;
debonding the processed wafer system by initiating separation between the release layer and the adhesive to obtain a thin processed wafer; and
cleaning the surface of the processed wafer with an organic solvent;
wherein the organic solvent is capable of dissolving the release layer;
optionally mechanically removing the adhesive after debonding the processed wafer system; and further optionally
comprises the step of prebaking the adhesive coated wafer at a temperature between about 90 to about 110° C.

11. The method of claim 10, wherein the release layer is one selected from the group of a silsesquioxane-based resin and a thermoplastic resin; the release layer capable of withstanding exposure up to about 180° C. without the occurrence of substantial cross-linking; and
the adhesive is a polysiloxane-based composition that includes a vinyl-functionalized oligomeric resin, a Si—H functional oligomeric resin, a catalyst and optionally an inhibitor;
wherein the release layer is not miscible with the adhesive.

12. The method of claim 11 wherein the thermoplastic material is one selected from the group of polysulfone, polyimide, and polyetherketone that can be dissolved in common solvents.

13. The method of claim 10, wherein the wafer processing operation is wafer grinding.

14. The method of claim 13, wherein a second processing operation is performed; the second processing operation being through-silicon via (TSV).

15. The bonding system of claim 9, wherein the endcapping groups, E, and the siloxane components C1, C2, and C3 in the vinyl-functionalized resin are further defined by the formula:

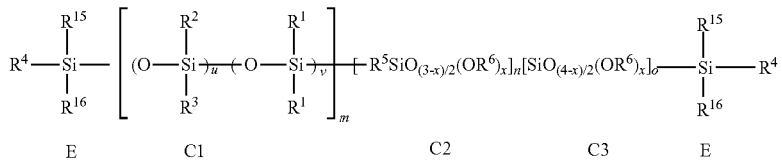

in which the subscript v is any number ranging between 0 and 1, the subscript u is any number ranging between 0 and 2, and $R^1$, $R^2$, $R^3$, $R^4$, $R^{15}$, and $R^{16}$ are independently selected organic groups having from 1 to 8 carbon atoms optionally substituted with fluorine, with at least one of the selected $R^2$, $R^3$, $R^4$, $R^{15}$, and $R^{16}$ groups being an aliphatic or aromatic group that includes vinyl functionality when subscript v is 1; $R^5$ is an organic group is an aliphatic or aromatic group having 1-12 carbons, or a combination thereof; $R^6$ is a hydrogen atom or a hydrocarbon group having from 1 to 4 carbon atoms; the degree of polymerization for each component, m, n, and o, are predetermined as integers with m being greater than zero and each integer selected such that the corresponding component exhibits the desired properties to adequately function in the adhesive.

16. The bonding system of claim 15, wherein at least one of the degrees of polymerization, n and o, for components C2 and C3, respectively, is greater than zero.

17. The bonding system of claim 9, wherein the release layer comprises a resin having at least one of three siloxane units according to the formula $(U1)_d(U2)_e(U3)_f$, in which d, e, and f represent the mole percent of each component in the resin with d ranging between about 0.025 to 1.0; e ranging between 0.0 to about 0.95; and f ranging between 0.0 to about 0.30;
wherein U1, U2, and U3 are further defined by the formula:

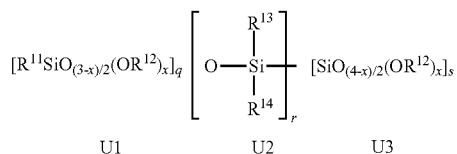

in which $R^{11}$ is an organic group containing 1 to 20 carbon atoms and optionally containing fluorine; $R^{12}$ is selected from a hydrogen atom and a hydrocarbon group containing between 1 to 4 carbon atoms; $R^{13}$ and $R^{14}$ are organic groups independently selected from a hydrogen atom, and organic groups optionally substituted with a fluorinated moiety having from 1 to 8 carbon atoms; the value of x is 0, 1, or 2; the degree of polymerization for each unit, q, r, and s, are predetermined as integers with q being greater than zero and each integer selected such that the corresponding unit exhibits the desired properties to adequately function in the release layer.

18. The bonding system of claim 17, wherein at least one of the degrees of polymerization, r and s, for units U2 and U3, respectively, is greater than zero.

19. A bonding system used to temporarily bond a support wafer to a semiconductor wafer in order to facilitate wafer processing operations; the bonding system comprising:
a first wafer and a second wafer;
a release layer located adjacent to a surface of the first wafer; the release layer being soluble in an organic solvent; and
an adhesive located adjacent to a surface of the second wafer; the adhesive being immiscible with the release layer;

wherein the adhesive and release layer can be temporarily bonded and debonded, wherein the release layer comprises a resin having at least one of three siloxane units according to the formula $(U1)_d(U2)_e(U3)_f$, in which d, e, and f represent the mole percent of each component in the resin with d ranging between about 0.025 to 1.0; e ranging between 0.0 to about 0.95; and f ranging between 0.0 to about 0.30;

wherein U1, U2, and U3 are further defined by the formula:

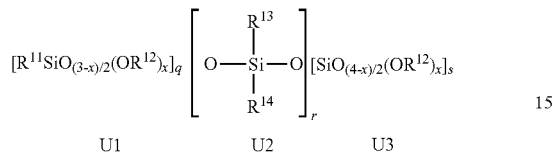

in which $R^{11}$ is an organic group containing 1 to 20 carbon atoms and optionally containing fluorine; $R^{12}$ is selected from a hydrogen atom and a hydrocarbon group containing between 1 to 4 carbon atoms; $R^{13}$ and $R^{14}$ are organic groups independently selected from a hydrogen atom, and organic groups optionally substituted with a fluorinated moiety having from 1 to 8 carbon atoms; the value of x is 0, 1, or 2; the degree of polymerization for each unit, q, r, and s, are predetermined as integers with q being greater than zero and each integer selected such that the corresponding unit exhibits the desired properties to adequately function in the release layer.

20. The bonding system of claim 19, wherein at least one of the degrees of polymerization, r and s, for units U2 and U3, respectively, is greater than zero.

* * * * *